United States Patent [19]

Schorman et al.

[11] Patent Number: 5,054,078

[45] Date of Patent: Oct. 1, 1991

[54] METHOD AND APPARATUS TO SUSPEND SPEECH

[75] Inventors: Eric R. Schorman, Bedford; Kevin M. Laird, Halton City, both of Tex.

[73] Assignee: Motorola, Inc., Schaumburg, Ill.

[21] Appl. No.: 489,144

[22] Filed: Mar. 5, 1990

[51] Int. Cl.⁵ .............................................. H03G 3/20
[52] U.S. Cl. .................................... 381/110; 381/94; 381/57; 455/297
[58] Field of Search ............... 455/297, 238, 186, 296; 381/57, 94, 110, 107; 379/57, 58, 59, 63

[56] References Cited

U.S. PATENT DOCUMENTS

| | | | |
|---|---|---|---|
| 4,468,813 | 8/1998 | Burke et al. | 379/58 |
| 4,677,389 | 6/1987 | Op De Beek et al. | 455/238 |
| 4,811,382 | 3/1989 | Sleevi | 379/67 |
| 4,827,458 | 5/1989 | D'Alayer De Costemore D'Arc | 381/57 |

Primary Examiner—Forester W. Isen
Attorney, Agent, or Firm—Michael J. Buchenhorner

[57] ABSTRACT

A communication device (10) comprises an input for receiving a first audio signal (12) and an input (36) for receiving a second audio signal. The communication device (10) also includes a circular buffer (34) for storing the output digital audio signal (12) and for producing an output audio signal (20). The communication device (10) determines whether at least a portion of the output audio signal (20) is present in the second audio signal. If such a portion is present, the communication device (10) subtracts the portion of the output audio signal (20) from the second audio signal, to produce a third audio signal (26). A threshold detector, responsive to the third audio signal, produces a first control signal, when the level of the third audio signal increases to at least a first predetermined level, and a second control signal, when the level of the third audio signal decreases to a value lower than a second predetermined level, where the second predetermined level is lower than the first predetermined level. Finally, a buffer control (22) causes the buffer (34) to suspend production of the output audio signal in response to the first control signal, and causes the buffer (34) to resume production of the audio signal (12), in response to the second control signal.

18 Claims, 2 Drawing Sheets

METHOD AND APPARATUS TO SUSPEND
SPEECH

TECHNICAL FIELD

This invention relates generally to communication systems and devices.

BACKGROUND

A person listening to a radio in a noisy environment (e.g., an automobile) may miss some of the received speech when a noise occurs (e.g., when a horn honks, a car door is slammed or a person in the car speaks). In such cases the radio user may have to ask the person at the other end to repeat the message. In broadcast situations, such as where one dispatcher is talking to many vehicles, requesting an interruption of the dispatcher is difficult. Moreover, in voice command communication systems, the person making a voice command may also miss portions of received audio while making voice commands.

SUMMARY OF THE INVENTION

Briefly, according to the invention, a communication device comprises means for receiving a first audio signal and means for receiving a second audio signal. The communication device also includes a buffer for storing the first digital audio signal at an input rate, and for producing an output audio signal at an output rate. The communication device determines whether at least a portion of the output audio signal is present in the second audio signal. If such a portion is present, the communication device subtracts the portion of the output audio signal from the second audio signal, to produce a third audio signal. Threshold detection means, responsive to the third audio signal, produce a first control signal, when the level of the third audio signal increases to at least a first predetermined level, and a second control signal, when the level of the third audio signal decreases to a value lower than a second predetermined level, where the second predetermined level is lower than the first predetermined level. Finally, buffer control means cause the buffer to suspend production of the output audio signal in response to the first control signal, and cause the buffer to resume production of the audio signal, in response to the second control signal.

DETAILED DESCRIPTION OF THE PREFERRED EMBODIMENT

Figure 1:
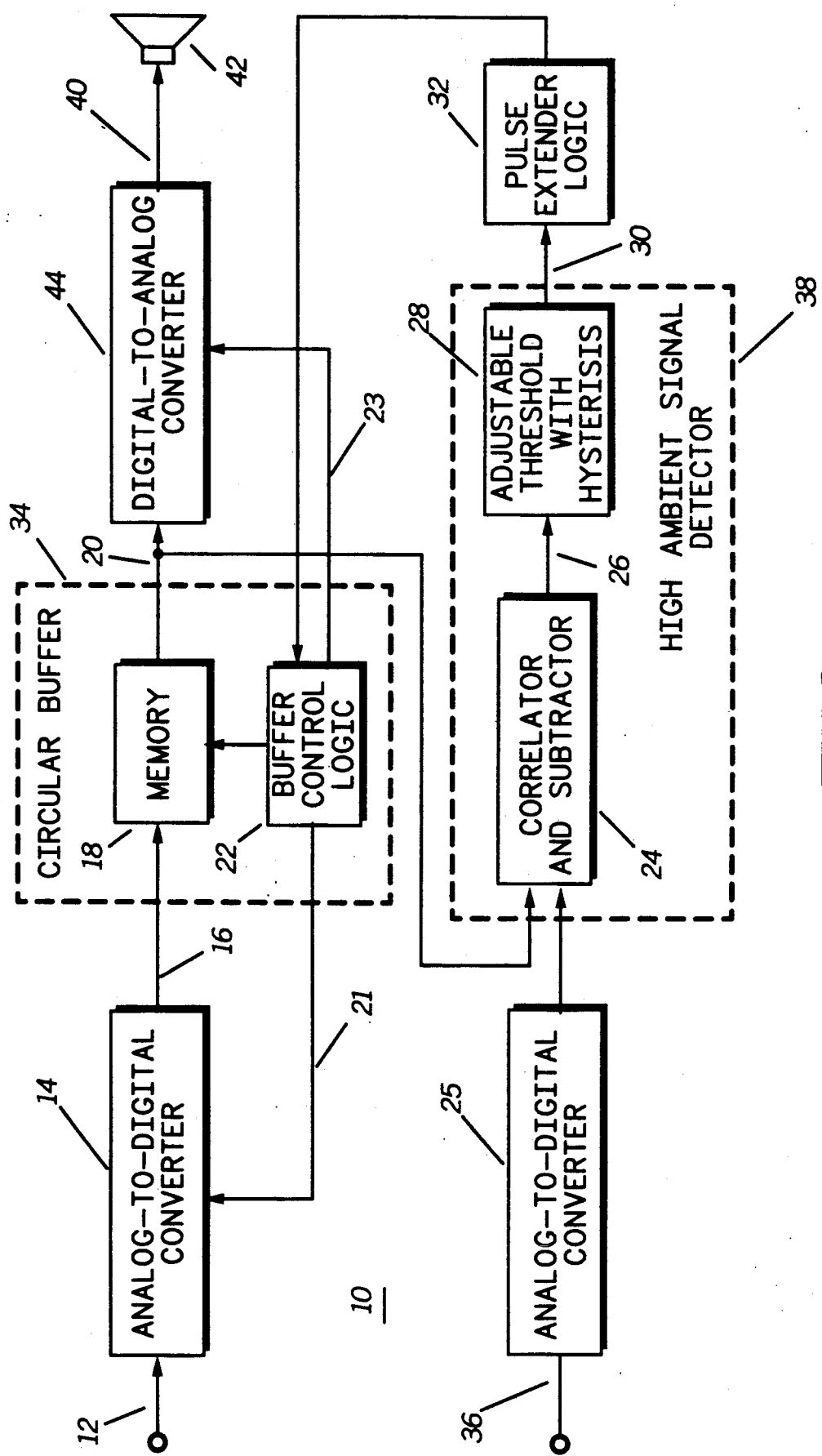
FIG. 1 is a simplified block diagram showing an audio-producing system in accordance with the invention.

Referring to FIG. 1, a simplified block diagram is shown, depicting a communication device 10 in accordance with the invention. An audio (e.g., speech) input signal 12 is provided to an analog-to-digital converter 14, for producing a digital audio signal 16 at an input rate set by the buffer control logic 22. The digital audio signal 16 is then sampled and stored in a circular buffer 34 (well known in the art) that comprises a memory 18 (e.g., a large DRAM) and buffer control logic 22. The buffer control logic 22 causes the memory 18 to sample and store the input audio signal 12 (at an input rate), and provides an input rate clock signal 21 to the analog-to-digital converter 14, and an output rate clock signal 23 to the digital-to-analog converter 44. The clock signals 21 and 23 set the input and output rates (respectively) of the device 10. Moreover, the buffer control logic 22 controls the memory address to cause successive samples to be stored in an increasing number of memory locations. The buffer control logic 22 additionally controls a similar process to read samples from the memory 18 to produce a digital audio signal 20, and convert it to a restored analog signal 40 with good fidelity, with a digital-to-analog converter 24, for presentation to a listener by a speaker 42. The rate at which the digital audio signals 20 are read from the memory 18 and converted to analog form, with the analog-to-digital converter 44, is controlled by the buffer control logic 22. In addition, the buffer control logic 22 can offset the read address from the write address of the audio stored in the memory 18, to produce a delay that is well known in the art.

The output process of the memory 18 can be stopped, thus resulting in a continual increase in the amount of speech 12 stored in the memory 18. In one embodiment of the invention, the output process may proceed at a rate identical to the input rate, resulting in a fixed delay. However, in another embodiment of the invention the output process may proceed at a higher rate than the input, thus gradually decreasing the total delay.

A high ambient signal detector 38 (a converse of a conventional speech detector) comprises a signal correlator and subtractor 24 and an adjustable threshold detector 28 with hysterisis. The inputs to the correlator and subtractor 24 are the digital audio signal 20 from the memory 18, and one or more ambient signal inputs 36, such as sounds (received by a microphone in a vehicle, for example) that are not produced by the communication device 10. The ambient signals received at the ambient signal inputs 36 are digitized by an analog-to-digital converter 25, before they are applied to the correlator and subtractor 24. The correlator and subtractor 24 can determine the delay from the speech output to the input devices, by cross-correlation, and then subtract at least a portion of the output signal 20 from the ambient signal inputs 36 to produce a signal 26 representing the net ambient noise level. The signal 26 is applied to the adjustable threshold detector 28 which provides a "high ambient signal" control signal 30 (which is Boolean) when the signal 26 equals or exceeds a first predetermined threshold level (i.e., a "true" condition). When the signal 26 decreases below a second predetermined threshold level, a false condition occurs. The second predetermined threshold level, which is lower than the first predetermined threshold level, may be selected so that hysterisis is accomplished. The first and second threshold levels could be preset (e.g., as with potentiometers), or could be dynamically determined from the time-averaged ambient signal level. Signal correlators, subtractors, and threshold means are frequently performed with digital signal processors, well known in the art.

The "high ambient signal" 30 is applied to decision logic circuitry 32 which, in turn, controls the buffer control logic 22. A false-to-true transition will stop the output process; while a true-to-false transition will start the output process from the point at which it was stopped. The pulse extender logic 32 delays the true-to-false transition by an optional, adjustable amount (e.g., less than one second). Optionally, the output process can then proceed at a slightly higher rate than than the input rate, to gradually decrease the output delay toward zero, while unobjectionally increasing the frequency of the stored speech. According to another option, the pulse extender logic 32 can decrease the output delay by causing pauses in the speech input signal 16 to be reduced by detecting and skipping memory locations that have low signal power.

Figure 2:
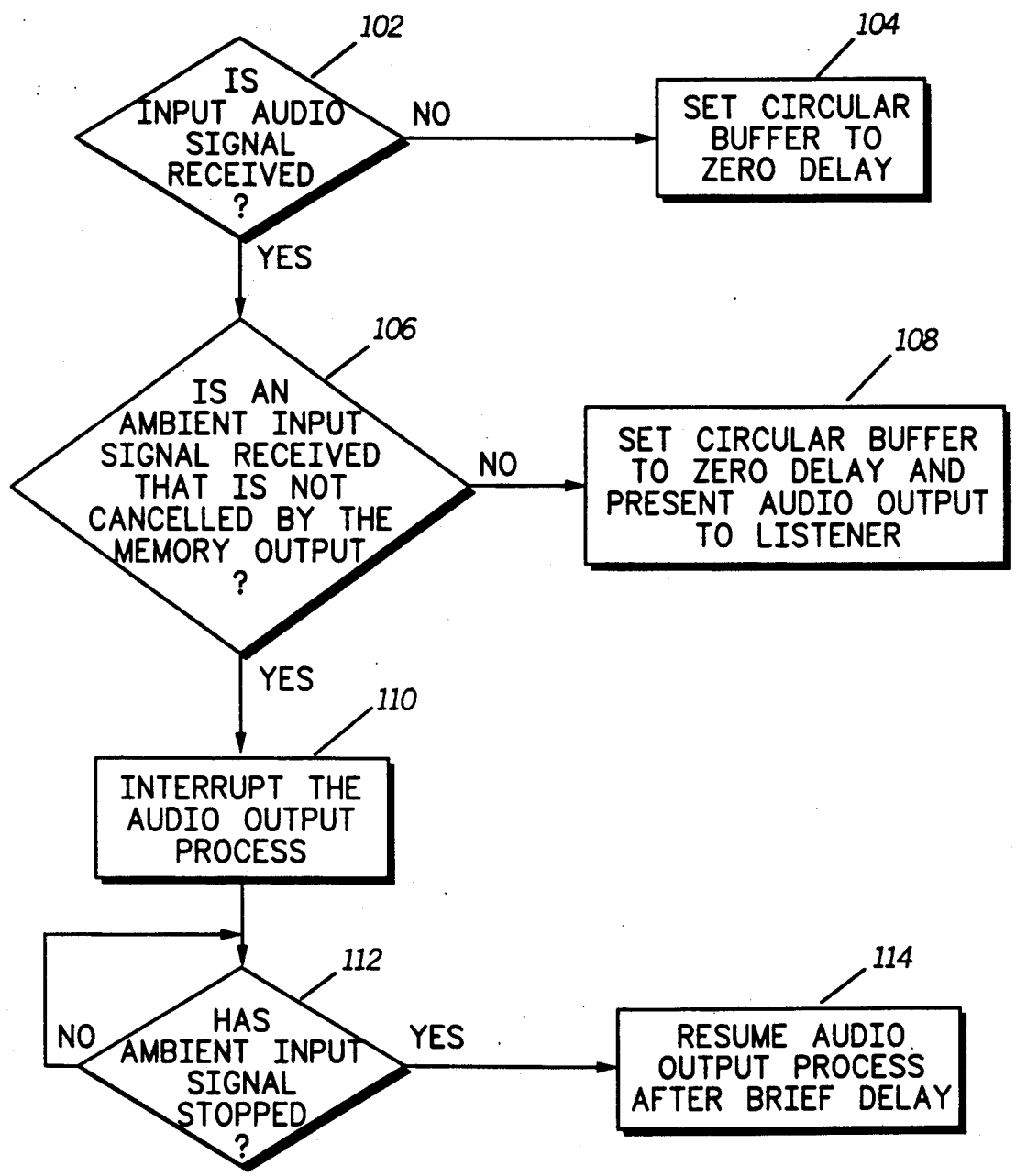
FIG. 2 is a flow chart illustrating a possible mode of operation for the communication device of the invention.

Referring to FIG. 2, a flow chart 100 illustrates a possible mode of operation for the communication device 10. Under decision 102, if no input audio signal 12 is present, the circular buffer 34 is set to zero delay (104). Under decision 106, when the audio input signal 12 is received, that signal 12 is passed (108) through the circular buffer 34 without delay to the speaker 42. The speaker signal is received by the ambient sound inputs 36 but will be substantially removed, and will not produce a "high ambient signal" decision. Also under decision 106, if an external source produces a sound that is received by the ambient sound inputs 36 which is not cancelled by the output audio signal 20, the output process is stopped (110). However, the input process continues, continually increasing the effective length of the output delay.

When the ambient sound stops (112), the "high ambient signal" decision becomes "false." After a brief delay, to allow the user to differentiate between the received signal from the ambient signal, the output process will resume (114) at the point where it left off at the time of interruption. The input and output processes will continue at substantially identical rates, with input and output signals delayed by the offset time (which is equal to the interruption time). Thus if a dispatcher is being heard, the delayed replica of the dispatcher's speech will be heard as if the dispatcher had paused during the interrupting sounds. The delay time remains constant until the received signal terminates and the delay line is flushed. At that time the circular buffer 34 is reset to zero delay.

According to another embodiment of the invention, if the communication device 10 is voice operated or there is another voice operated device near the communication device 10, the ambient signal inputs could be set to receive the voice commands and the audio output process could be interrupted by the voice commands in the manner described above. Therefore, the invention provides a way to preserve an entire message received by the communication device 10 even when ambient sounds or voice commands interrupt reception.

What is claimed is:

1. A communication device, comprising:
    means for receiving a first audio signal;
    means for receiving a second audio signal;
    a buffer for storing the first audio signal at an input rate, and for producing an output audio signal at an output rate;
    determining means for determining whether at least a portion of the output audio signal is present in the second audio signal;
    subtracting means for subtracting the portion of the output audio signal from the second audio signal, to produce a third audio signal;
    threshold detection means responsive to the third audio signal, for producing a first control signal when the third audio signal increases at least to a first predetermined level, and for producing a second control signal when the third audio signal decreases below a second predetermined level, the second predetermined level being lower than the first predetermined level; and
    buffer control means for causing the buffer to suspend production of the output audio signal in response to the first control signal, and for causing the buffer to resume production of the output audio signal, in response to the second control signal.

2. The communication device of claim 1, further comprising:
    an analog-to-digital converter for converting the first audio signal into digital form before the first audio signal is stored in the buffer;
    a digital-to-analog converter for converting the output audio signal to analog form, and
    an analog-to-digital converter for converting the second audio signal into digital form.

3. The communication device of claim 1, wherein the input rate is equal to the output rate.

4. The communication device of claim 1, wherein the output rate is greater than the input rate.

5. The communication device of claim 1, wherein the buffer control means controls the output rate of the buffer.

6. The communication device of claim 1, wherein the second audio signal is noise produced by a source different from the source of the first audio signal.

7. The communication device of claim 1, wherein the second audio signal is a voice command produced by a source different from the source of the first audio signal.

8. The communication device of claim 1, wherein the communication device is a radio.

9. The communication device of claim 1, wherein the determining means comprises a correlator.

10. The communication device of claim 4, wherein the buffer control means locates pauses in the first audio signal and removes the pauses during production of the output audio signal.

11. The communication device of claim 5, wherein the buffer control means causes the output rate to be greater than the input rate.

12. A method for suspending the production of an audio signal, comprising the steps of:
    receiving a first audio signal;
    receiving a second audio signal;
    storing the first audio signal in a buffer, at an input rate;
    producing an output audio signal at an output rate;
    removing at least a portion of any of the output audio signal present in the second audio signal, to produce a third audio signal;
    producing a first control signal when the third audio signal increases at least to a first predetermined level;
    producing a second control signal when the third audio signal decreases below a second predetermined level, the second predetermined level being lower than the first predetermined level;
    causing the buffer to suspend production of the output audio signal in response to the first control signal; and
    causing the buffer to resume production of the output audio signal, in response to the second control signal.

13. The method of claim 12, further comprising the steps of:
    converting the first audio signal into digital form; and
    converting the second audio signal into digital form.

14. The method of claim 12, further comprising the step of causing the input rate to be equal to the output rate.

15. The method of claim 12, further comprising the step of causing the output rate to be greater than the input rate.

16. The method of claim 12, wherein the second audio signal is noise produced by a source different from the source of the first audio signal.

17. The method of claim 12, wherein the second audio signal is a voice command produced by a source different from the source of the first audio signal.

18. The method of claim 12, further comprising the step of locating pauses in the first audio signal and removing the pauses during production of the output audio signal.

* * * * *